United States Patent [19]

Suzuki et al.

[11] Patent Number: 4,775,810
[45] Date of Patent: Oct. 4, 1988

[54] PARITY CHECK LOGIC CIRCUIT

[75] Inventors: Atsushi Suzuki, Kawasaki; Masashi Nagashima, Yokohama, both of Japan

[73] Assignee: Fujitsu Limited, Kanagawa, Japan

[21] Appl. No.: 22,292

[22] Filed: Mar. 5, 1987

[30] Foreign Application Priority Data

Mar. 20, 1986 [JP] Japan .................................. 61-064604

[51] Int. Cl.$^4$ ...................... G06F 7/50; H03K 17//16; H03K 19/20
[52] U.S. Cl. .................................. 307/471; 307/443; 307/445; 307/448; 371/49
[58] Field of Search ............... 307/471, 443, 448, 445; 371/49

[56] References Cited

FOREIGN PATENT DOCUMENTS 0126326 10/1981 Japan .................................. 307/471

Primary Examiner—John S. Heyman
Assistant Examiner—M. R. Wambach
Attorney, Agent, or Firm—Armstrong, Nikaido, Marmelstein & Kubovcik

[57] ABSTRACT

A multiple-input logic circuit for carrying out an even parity check operation or an odd parity check operation on a plurality of input signals has such a circuit construction that a signal only passes through a maximum of essentially two gates between an input and an output of the multiple-input logic circuit, so as to increase the operation speed and reduce the number of elements constituting the multiple-input logic circuit.

4 Claims, 4 Drawing Sheets

4,775,810

PARITY CHECK LOGIC CIRCUIT

BACKGROUND OF THE INVENTION

The present invention generally relates to logic circuits, and more particularly to a multiple-input logic circuit having a complementary metal oxide semiconductor (CMOS) structure for carrying out an exclusive-OR (even parity check) or an exclusive-NOR (odd parity check) operation.

As will be described later on in conjunction with the drawings, a conventional 2-input exclusive-OR logic circuit having a CMOS structure comprises sixteen transistors. A signal passes through a maximum of three gates between an input and an output of such a 2-input exclusive-OR logic circuit. In the case of a conventional 3-input exclusive-OR logic (even parity check) circuit having the CMOS structure, thirty-eight transistors are required.

Accordingly, the conventional exclusive-OR logic circuits suffer problems in that a large number of elements are required, a signal must pass through a large number of gates between the input and the output of the exclusive-OR logic circuit, and the operation speed of the logic circuit is slow for this reason. In addition, when an inverted signal of an output signal of the exclusive-OR logic circuit is to be obtained, it is necessary to add an inverter, and there are problems in that the number of elements increases and the operation speed becomes even slower because of the increased number of gates.

SUMMARY OF THE INVENTION

Accordingly, it is a general object of the present invention to provide a novel and useful multiple-input logic circuit in which the problems described heretofore are eliminated.

Another and more specific object of the present invention is to provide a multiple-input logic circuit having such a circuit construction that a signal only passes through a maximum of essentially two gates between an input and an output of the multiple-input logic circuit. According to the multiple-input logic circuit of the present invention, the operation speed is increased and the number of elements is effectively reduced compared to the conventional multiple-input logic circuit.

Other objects and further features of the present invention will be apparent from the following detailed description when read in conjunction with the accompanying drawings.

DETAILED DESCRIPTION

Figure 1:
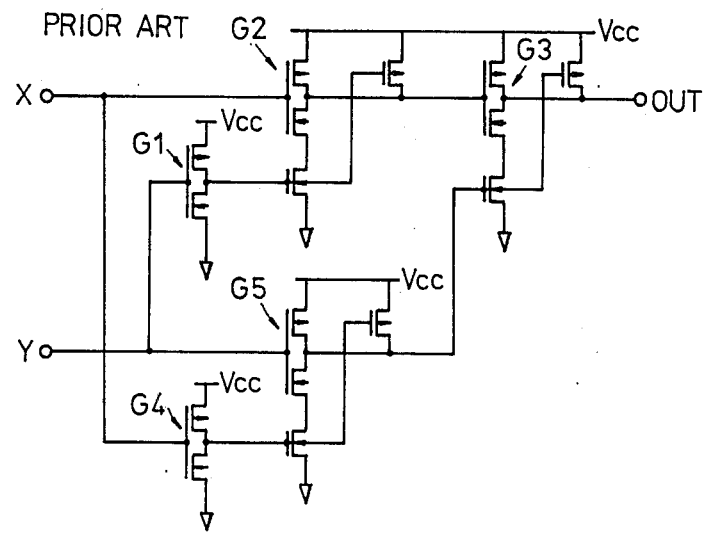
FIG. 1 is a circuit diagram showing an example of the conventional 2-input exclusive-OR logic circuit.

FIG. 1 shows an example of the conventional 2-input exclusive-OR logic circuit comprising two inverters G1 and G4 and three NAND gates G2, G3 and G5. In FIG. 1 and figures which will be described hereunder, Vcc denotes a power source voltage. The 2-input exclusive-OR logic circuit shown in FIG. 1 comprises a total of sixteen transistors, and an input signal X or Y passes through a maximum of three gates.

Figure 2:
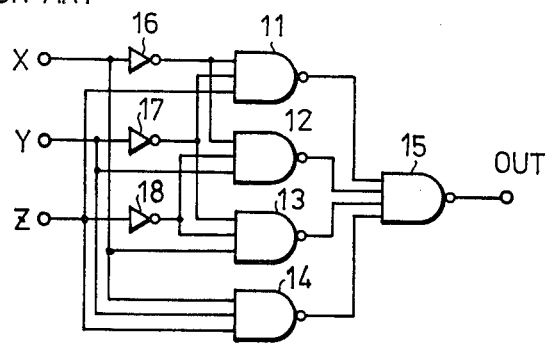
FIG. 2 is a circuit diagram showing an example of the conventional 3-input exclusive-OR logic (even parity check or generating) circuit.
Figure 3:
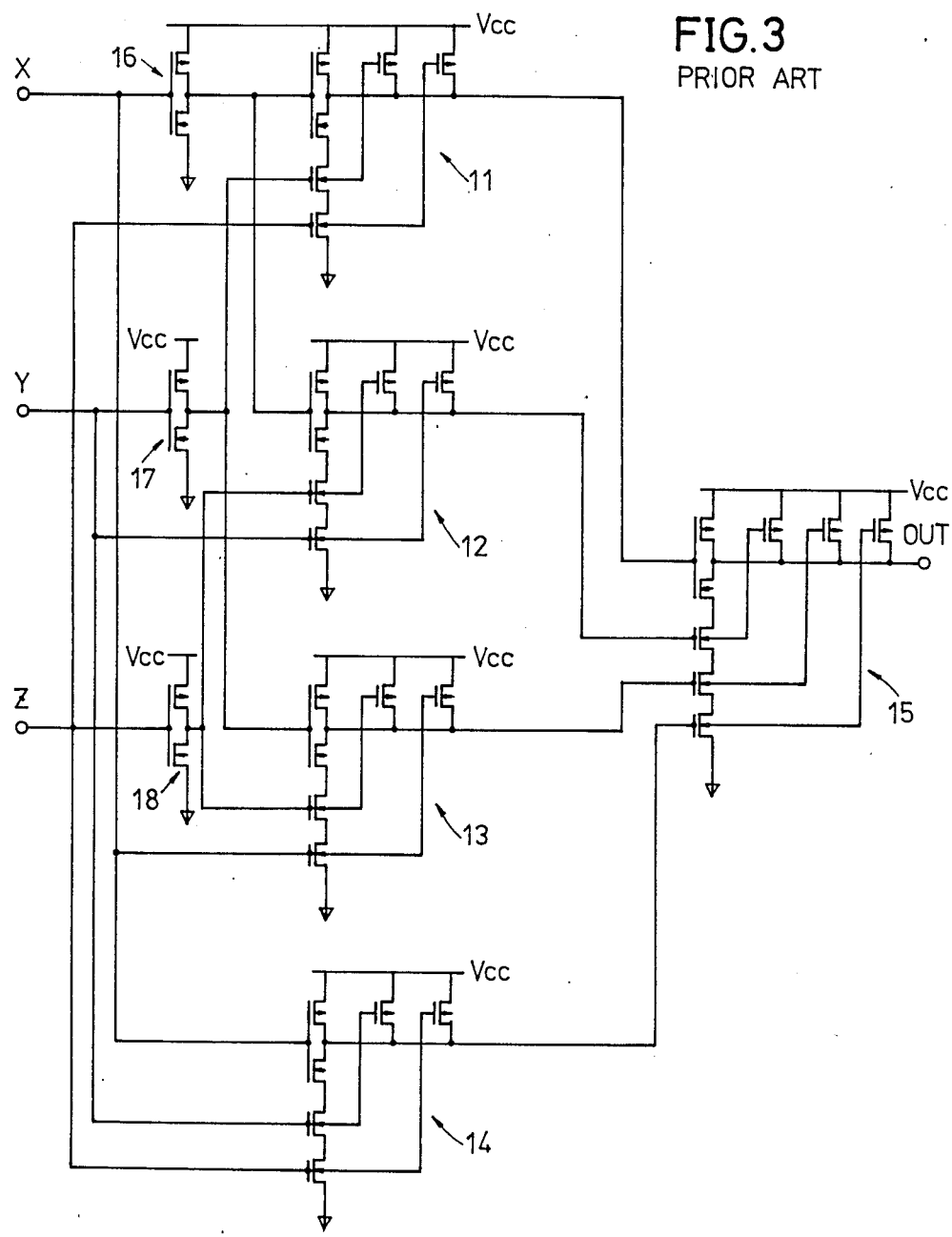
FIG. 3 is a circuit diagram showing the concrete circuit construction of the circuit shown in FIG. 2.

FIG. 2 shows an example of the conventional 3-input exclusive-OR logic (even parity check or generating) circuit comprising five NAND gates 11 through 15 and three inverters 16 through 18. The concrete circuit construction of this 3-input even parity check circuit is shown in FIG. 3. In FIG. 3, those parts which are the same as those corresponding parts in FIG. 2 are designated by the same reference numerals. This 3-input even parity check circuit comprises a total of thirty-eight transistors and comprises an even larger number of elements than the 2-input exclusive-OR logic circuit shown in FIG. 1.

Accordingly, the conventional exclusive-OR logic (or even parity check) circuits suffer problems in that a large number of elements are required, a signal must pass through a large number of gates between the input and the output of the logic circuit, and the operation speed of the logic circuit is slow for this reason. In addition, when an inverted signal of an output signal of the exclusive-OR logic (even parity check) circuit is to be obtained, it is necessary to add an inverter, and there are problems in that the number of elements increases and the operation speed becomes even slower because of the increased number of gates.

Figure 4:
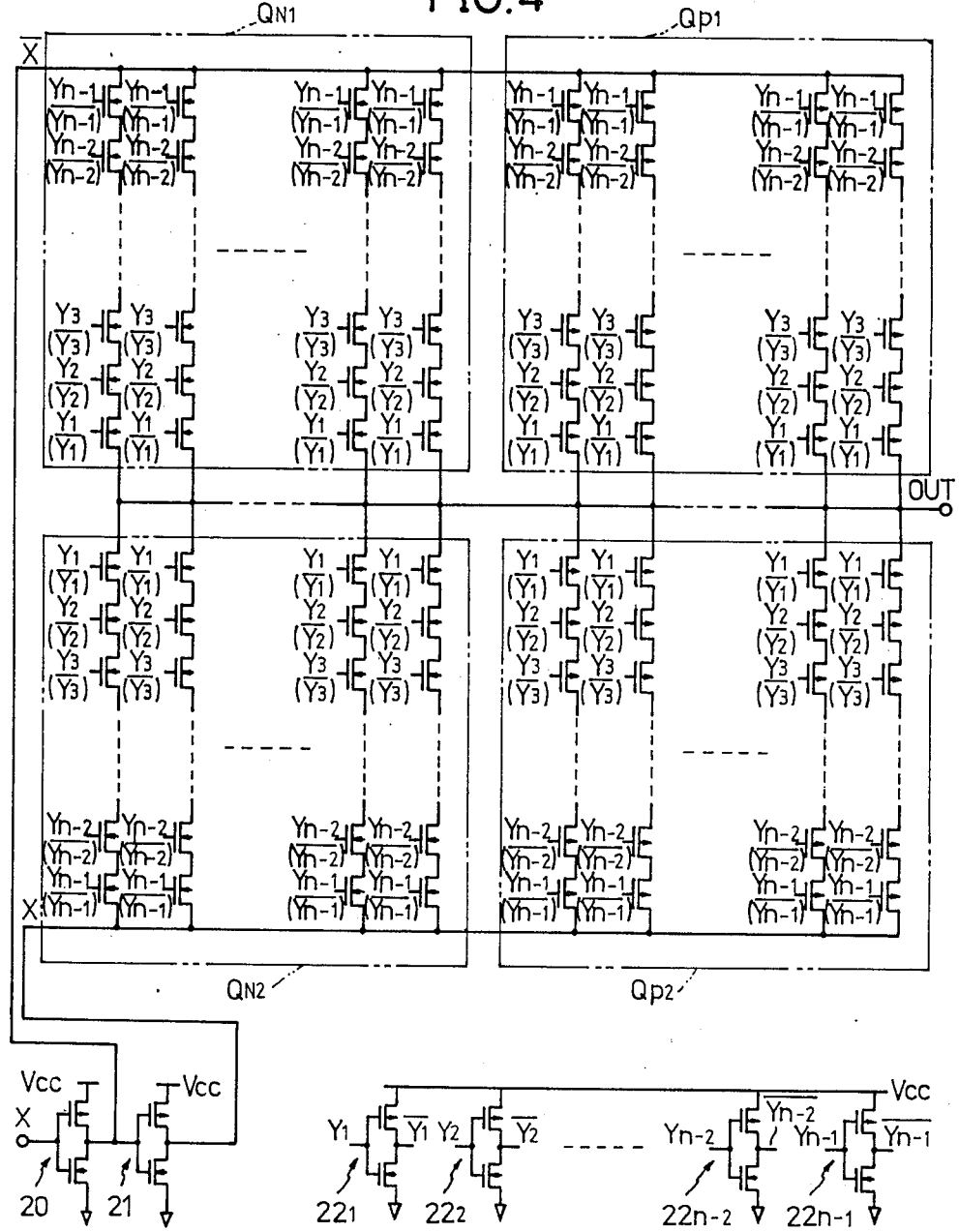
FIG. 4 is a circuit diagram generally showing an embodiment of the multiple-input logic circuit according to the present invention.

FIG. 4 shows an embodiment of a multiple-input logic circuit according to the present invention for the case where an exclusive-OR (even parity check) operation is to be carried out for n input signals, where $n \geq 2$. The n-input logic circuit generally comprises inverters 20, 21 and $22_1$ through $22_{n-1}$, two N-channel circuit blocks QN1 and QN2, and two P-channel circuit blocks QP1 and QP2. The N-channel circuit block QN1 comprises $2^{n-2}$ columns of series connected circuits each comprising $n-1$ N-channel transistors, and the P-channel circuit block QP1 comprises $2^{n-2}$ columns of series connected circuits each comprising $n-1$ P-channel transistors. In the circuit blocks QN1 and QP1, all of the series connected circuits are coupled in parallel between an input line supplied with the inverted signal $\overline{X}$ and an output line connected to an output terminal OUT. Similarly, the N-channel circuit block QN2 comprises $2^{n-2}$ columns of series connected circuits each comprising $n-1$ N-channel transistors, and the P-channel circuit block QP2 comprises $2^{n-2}$ columns of series connected circuits each comprising $n-1$ P-channel transistors. In the circuit blocks QN2 and QP2, all of the series connected circuits are coupled in parallel between an input line supplied with the input signal X and the output line. Each transistor in one column of one circuit block are supplied with one of $n-1$ input signals $Y_1, Y_2, \ldots, Y_{n-1}$ and inverted signals $\overline{Y}_1, \overline{Y}_2, \ldots, \overline{Y}_{n-1}$ from the respective inverters $22_1$ through $22_{n-1}$ to gates thereof.

In one column within the circuit block QN1 (or QN2), an odd number of input signals out of the input signals $Y_1$ through $Y_{n-1}$ are supplied to the gates of an odd number of transistors in the column, and inverted signals of remaining ones of the input signals $Y_1$ through $Y_{n-1}$ are supplied to the gates of remaining transistors in the column. In another column within the circuit block QN1 (or QN2), another odd number of input signals out of the input signals $Y_1$ through $Y_{n-1}$ are supplied to the gates of another odd number of transistors in the column, and inverted signals of remaining ones of the input signals $Y_1$ through $Y_{n-1}$ are supplied to the gates of remaining transistors in the column. Similarly thereafter, an odd number of input signals out of the input signals $Y_1$ through $Y_{n-1}$ are supplied to the gates of an odd number of transistors in the column and inverted signals of remaining ones of the input signals $Y_1$ through $Y_{n-1}$ are supplied to the gates of remaining transistors in the column, where the the combination of the odd number of the input signals supplied to the gates of the transistors of the columns is different for each column, so that there are $2^{n-2}$ combinations of the odd number of the input signals and inverted signals of remaining ones of the input signals supplied to the transistors of the columns in the circuit block QN1 (or QN2). This is because there are $2^{n-2}$ possible combinations for selecting an odd number of input signals to be supplied to the transistors in the columns of the circuit block QN1 (or QN2).

In one column within the circuit block QN2 (or QN1), an even number (zero inclusive) of input signals out of the input signals $Y_1$ through $Y_{n-1}$ are supplied to the gates of an even number of transistors in the column, and inverted signals of remaining ones of the input signals $Y_1$ through $Y_{n-1}$ are supplied to the gates of remaining transistors in the column. In another column within the circuit block QN1 (or QN2), another even number (zero inclusive) of input signals out of the input signals $Y_1$ through $Y_{n-1}$ are supplied to the gates of another even number of transistors in the column, and inverted signals of remaining ones of the input signals $Y_1$ through $Y_{n-1}$ are supplied to the gates of remaining transistors in the column. Similarly thereafter, an even number (zero inclusive) of input signals out of the input signals $Y_1$ through $Y_{n-1}$ are supplied to the gates of an even number of transistors in the column and inverted signals of remaining ones of the input signals $Y_1$ through $Y_{n-1}$ are supplied to the gates of remaining transistors in the column, where the combination of the even number (zero inclusive) of input signal supplied to the transistors of the columns is different for each column, so that there are $2^{n-2}$ combinations of the even number (zero inclusive) of input signals and inverted signals of remaining ones of the input signals supplied to the transistors of the columns in the circuit block QN2 (or QN1). This is because there are $2^{n-2}$ possible combinations for selecting an even number of input signals to be supplied to the transistors in the columns of the circuit block QN2 (or QN1).

In one column within the circuit block QP1 (or QP2), an odd number of inverted signals of the input signals out of the input signals $Y_1$ through $Y_{n-1}$ are supplied to the gates of an odd number of transistors in the column, and remaining ones of the input signals $Y_1$ through $Y_{n-1}$ are supplied to the gates of remaining transistors in the column. In another column within the circuit block QP1 (or QP2), another odd number of inverted signals of the input signals out of the input signals $Y_1$ through $Y_{n-1}$ are supplied to the gates of another odd number of transistors in the column, and remaining ones of the input signals $Y_1$ through $Y_{n-1}$ are supplied to the gates of remaining transistors in the column. Similarly thereafter, an odd number of inverted signals of the input signals out of the input signals $Y_1$ through $Y_{n-1}$ are supplied to the gates of an odd number of transistors in the column and remaining ones of the input signals $Y_1$ through $Y_{n-1}$ are supplied to the gates of remaining transistors in the column, where the combination of the odd number inverted signals supplied to the transistors of the columns is different for each column, so that there are $2^{n-2}$ combinations of the odd number of inverted signals of the input signals and remaining ones of the input signals supplied to the transistors of the columns in the circuit block QP1 (or QP2). This is because there are $2^{n-2}$ possible combinations for selecting an odd number of inverted signals to be supplied to the transistors in the columns of the circuit block QP1 (or QP2).

In one column within the circuit block QP2 (or QP1), an even number (zero inclusive) of inverted signals of the input signals out of the input signals $Y_1$ through $Y_{n-1}$ are supplied to the gates of an even number of transistors in the column, and remaining ones of the input signals $Y_1$ through $Y_{n-1}$ are supplied to the gates of remaining transistors in the column. In another column within the circuit block QN1 (or QN2), another even number (zero inclusive) of inverted signals of the input signals out of the input signals $Y_1$ through $Y_{n-1}$ are supplied to the gates of another even number of transistors in the column, and remaining ones of the input signals $Y_1$ through $Y_{n-1}$ are supplied to the gates of remaining transistors in the column. Similarly thereafter, an even number (zero inclusive) of inverted signals of the input signals out of the input signals $Y_1$ through $Y_{n-1}$ are supplied to the gates of an even number of transistors in the column and remaining ones of the input signals $Y_1$ through $Y_{n-1}$ are supplied to the gates of remaining transistors in the column, where the combination of the even number (zero inclusive) of inverted signals supplied to the transistors of the columns is different for each column, so that there are $2^{n-2}$ combinations of the even number (zero inclusive) of inverted signals of the input signals and remaining ones of the input signals supplied to the transistors of the columns in the circuit block QP2 (or QP1). This is because there are $2^{n-2}$ possible combinations for selecting an even number of inverted signals to be supplied to the transistors in the columns of the circuit block QP2 (or QP1).

In FIG. 4, the illustration of lines for supplying the input signals $Y_1$ through $Y_{n-1}$ and inverted signals thereof to the circuit blocks QN1, QN2, QP1 and QP2 is omitted for convenience' sake so as to simplify the circuit diagram.

According to the circuit shown in FIG. 4, the number of elements (transistors) which are required can be calculated from the following equation.

$$4+2\times(n-1)+4\times[(n-1)\times 2^{n-2}]=4+2\cdot(n-1)+2^n\cdot(n-1)$$

Therefore, the number of elements which are required to constitute the logic circuit is considerably reduced compared to the number of elements required in the conventional logic circuit, and this effect becomes greater as the value of n increases.

In addition, as may be seen from FIG. 4, a signal only needs to pass through a maximum of essentially two gates between the input and the output of the logic circuit, and the speed of the circuit operation is increased compared to that of the conventional logic circuit.

The logic circuit shown in FIG. 4 operates as an exclusive-OR logic (even parity check or generating) circuit. However, by interchanging the connection of the cirucit blocks QN1 and QN2 and the connection of the circuit blocks QP1 and QP2, it is possible to realize an exclusive-NOR logic (odd parity check or generating) circuit.

Furthermore, each of the circuit blocks QN1, QN2, QP1 and QP2 may comprise more than $2^{n-2}$ columns of series connected circuits each comprising $n-1$ transistors, provided that there are $2^{n-2}$ combinations of the input signals $Y_1$ through $Y_{n-1}$ and inverted signals thereof supplied to the transistors of the columns in the circuit block. In other words, in the case of an n-input logic circuit, each circuit block should comprise at least $2^{n-2}$ columns of series connected circuits each comprising $n-1$ transistors, and there should be $2^{n-2}$ combinations of the input signals $Y_1$ through $Y_{n-1}$ and inverted signals thereof supplied to the transistors of the columns in the circuit block. When there conditions are satisfied, there may be two or more columns of series connected circuits supplied with the same combination of the input signals $Y_1$ through $Y_{n-1}$ and inverted signals thereof when there are more than $2^{n-2}$ columns of series connected circuits in one circuit block, but the operation of the logic circuit will be the same as in the embodiment described before.

Next, description will be given with respect to an embodiment of the logic circuit according to the present invention for the case where there are two inputs and an exclusive-OR operation is to be carried out, by referring to FIG. 5. The 2-input exclusive-OR logic circuit shown in FIG. 5 comprises the inverters 20, 21 and $22_1$, an N-channel transistor TN1 which corresponds to the circuit block QN1, an N-channel transistor TN2 which corresponds to the circuit block QN2, a P-channel transistor TP1 which corresponds to the circuit block QP1, and a P-channel transistor TP2 which corresponds to the circuit block QP2. An input signal $Y_1$ is applied to the gates of the transistors TN1 and TP2, and an inverted signal $\overline{Y}_1$ from the inverter $22_1$ is applied to the gates of the transistors TP1 and TN2. An input signal X from the inverter 21 is applied to a connecting node between the transistors TP2 and TN2, and an inverted signal $\overline{X}$ from the inverter 20 is applied to a connecting node between the transistors TN1 and TP1. Other connecting nodes of the transistors TN1, TN2, TP1 and TP2 are connected to an output terminal OUT.

When the input signals (X, $Y_1$) are (0, 0), the transistors TN2 is turned ON, the transistor TP1 is turned OFF, the transistor TP2 is turned ON and the transistor TN1 is turned OFF because the input signal $Y_1$ has a low level. Since the input signal X has the low level, the output node is pulled down to the low level via the transistor TN2 and the output level at the output terminal OUT becomes low or "0".

When the input signals (X, $Y_1$) are (0, 1), the transistors TN1 and TP1 are turned ON and the transistors TP2 and TN2 are turned OFF because the input signal $Y_1$ has a high level. Since the inverted signal $\overline{X}$ has a high level, the output node is pulled up to the high level via the transistor TP1 and throutput level at the output terminal OUT becomes high or "1".

When the input signals (X, $Y_1$) are (1, 0), the transistors TP2 and TN2 are turned ON and the transistors TN1 and TP1 are turned OFF because the input signals $Y_1$ has a low level. Since the input signals X has a high level, the output node is pulled up to the high level via the transistor TP2 and the the output level at the output terminal OUT becomes high or "1".

When the input signals (X, $Y_1$) are (1, 1), the transistors TN1 and TP1 are turned ON and the transistors TN2 and TP2 are turned OFF because the input signal $Y_1$ has a high level. Since the inverted signal $\overline{X}$ has a low level, the output node is pulled down to the low level via the transistor TN1 and the output level at the output terminal OUT becomes low or "0".

Figure 5:
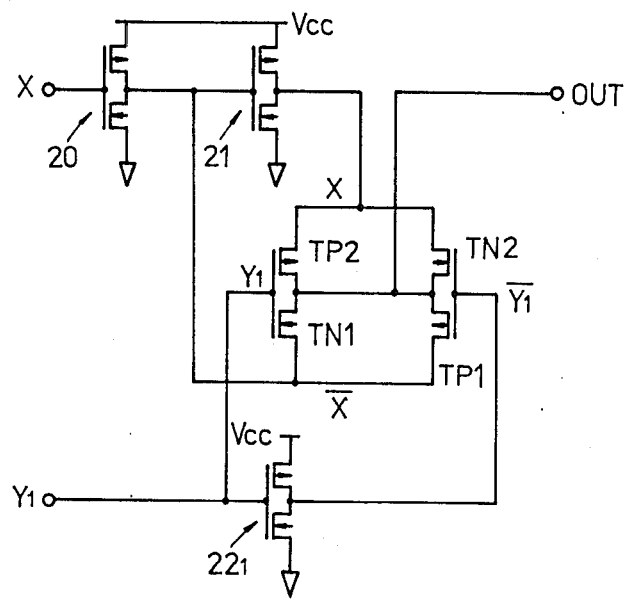
FIG. 5 is a circuit diagram showing an embodiment of the logic circuit according to the present invention for the case where there are two inputs and an exclusive-OR operation is to be carried out.

The following Table 1 shows a truth table describing the operation of the circuit shown in FIG. 5, together with the transistor in the path which contributes to the high or low level output. As may be seen from Table 1, the path including the N-channel transistor is used to produce a low-level ("0") output, and the path including the P-channel transistor is used to produce a high-level ("1") output.

TABLE 1

| X | $Y_1$ | OUT | Path |
|---|---|---|---|
| 0 | 0 | 0 | TN2 |
| 0 | 1 | 1 | TP1 |
| 1 | 0 | 1 | TP2 |
| 1 | 1 | 0 | TN1 |

Accordingly, it can be seen that the circuit shown in FIG. 5 functions as a 2-input exclusive-OR logic circuit.

The output node is pulled down to the low level via the transistor TN2 and the inverter 21 or is pulled up to the high level via the transistor TP2 and the inverter 21. Hence, although a signal must pass through three gates between the input and the output of the conventional 2-input exclusive-OR logic circuit, a signal only needs to pass through two gates between the input and the output of the circuit shown in FIG. 5. As a result, the operation speed of the circuit is increased compared to the conventional circuit. In addition, the present embodiment only requires ten transistors to constitute the 2-input exclusive-OR logic circuit while the conventional circuit requires sixteen transistors.

Figure 6:
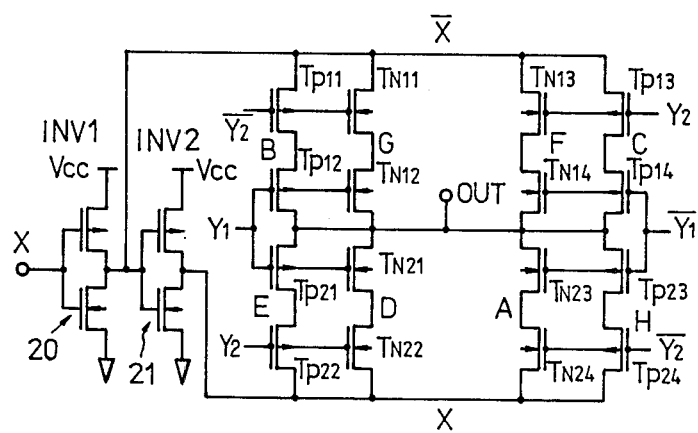
FIG. 6 is a circuit diagram showing an embodiment of the logic circuit according to the present invention for the case where there are three inputs and an exclusive-OR (even parity check) operation is to be carried out.

Next, description will be given with respect to an embodiment of the logic circuit according to the present invention for the case where there are three inputs and an exclusive-OR (even parity check) operation is to be carried out, by referring to FIG. 6. In FIG. 6, the illustration of inverters for inverting input signals $Y_1$ and $Y_2$ are omitted for convenience' sake. P-channel transistors TP11 through TP14 constitute the circuit block QP1 shown in FIG. 4, P-channel transistors TP21 through TP24 constitute the circuit block QP2, N-channel transistors TN11 through TN14 constitute the circuit block QN1, and N-channel transistors TN21 through TN24 constitute the circuit block QN2.

The following Table 2 shows a truth table describing the operation of the circuit shown in FIG. 6, together with the path which contributes to the high or low level output. As may be seen from Table 2, the path including the N-channel transistors is used to produce a low-level ("0") output, and the path including the P-channel transistors is used to produce a high-level ("1") output.

TABLE 2

| X | Y₁ | Y₂ | OUT | Path |
|---|----|----|-----|------|
| 0 | 0  | 0  | 0   | A    |
| 0 | 0  | 1  | 1   | B    |
| 0 | 1  | 0  | 1   | C    |
| 0 | 1  | 1  | 0   | D    |
| 1 | 0  | 0  | 1   | E    |
| 1 | 0  | 1  | 0   | F    |
| 1 | 1  | 0  | 0   | G    |
| 1 | 1  | 1  | 1   | H    |

According to the present embodiment, the number of transistors required to constitute the 3-input exclusive-OR logic (even parity check or generating) circuit can be reduced to twenty-four, while the conventional 3-input exclusive-OR logic (even parity check or generating) circuit requires thirty-eight transistors. In addition, a signal only needs to pass through two gates between the input and the output of the circuit, and the operation speed of the circuit is increased compared to that of the conventional circuit.

Description given heretofore relate to the exclusive-OR logic (or even parity check or generating) circuits, but the circuits described heretofore can be used as exclusive-NOR logic (or odd parity check or generating) circuits by making simple modifications thereto. In other words, in the circuit shown in FIG. 4, an exclusive-NOR (odd parity check) operation can be carried out by interchanging the input signal X and the inverted signal $\overline{X}$ supplied to the two input lines, interchanging the connection of the circuit blocks QN1 and QN2 and the connection of the circuit blocks QP1 and QP2, or interchanging one of the input signals $Y_1$ through $Y_{n-1}$ by an inverted signal thereof. For example, in the circuit shown in FIG. 5, an exclusive-NOR opertion can be carried out by using P-channel transistors for the transistors TN1 and TN2 and using N-channel transistors for the transistors TP1 and TP2.

As described heretofore, according to the present invention, the number of elements constituting the exclusive-OR logic (even parity check or generating) circuit or the exclusive-NOR logic (odd parity check or generating) circuit can be reduced considerably compared to the conventional circuit, and a signal only needs to pass through a maximum of two gates between the input and the output of the circuit. Hence, the operation speed of the circuit is increased compared to the conventional circuit. In addition, it is possible to modify the circuit so as to carry out either the exclusive-OR (even parity check) operation or the exclusive-NOR (odd parity check) operation, without adding an additional inverter.

Further, the present invention is not limited to these embodiments, but various variations and modifications may be made without departing from the scope of the present invention.

What is claimed is:

1. An n-input logic circuit receiving n input signals including a first input signal and outputting an output signal dependent on $2^n$ combinations of logic levels of n input signals, where $n \geq 2$, said logic circuit comprising:
   inverting means for providing n inverted input signals including an inverted first input signal;
   a first node supplied with the first input signal;
   a second node supplied with the inverted first input signal;
   an output node from which the output signal is output;
   a first circuit block including $2^{n-2}$ paths, each connected in parallel between said first node and said output node, each of the paths having n−1 P-channel transistors inserted in series therein and being turned on in accordance with a predetermined combination of the input and inverted input signals, except the first and inverted first input signals, wherein a high logic level at said first node is transferred through one of the $2^{n-2}$ paths in said first circuit block;
   a second circuit block including $2^{n-2}$ paths, each connected in parallel between said first node and said output node, each of the paths having n−1 N-channel transistors inserted in series therein and being turned on in accordance with a predetermined combination of the input and inverted input signals, except the first and inverted first input signals, wherein a low logic level at said first node is transferred through one of the $2^{n-2}$ paths in said second circuit block;
   a third circuit block including $2^{n-2}$ paths, each connected in parallel between said second node and said output node, each of the paths having n−1 P-channel transistors inserted in series therein and being turned on in accordance with a predetermined combination of the input and inverted input signals, except the first and inverted first input signals, wherein a high logic level at said second node is transferred through one of the $2^{n-2}$ paths in said third circuit block; and
   a fourth circuit block including $2^{n-2}$ paths, each connected in parallel between said second node and said output node, each of the paths having n−1 N-channel transistors inserted in series therein and being turned on in accordance with a predetermined combination of the input and inverted input signals, except the first and inverted first input signals, wherein a low logic level at said second node is transferred through one of the $2^{n-2}$ paths in said fourth circuit block.

2. An n-input logic circuit as claimed in claim 1 which carries out an even parity check operation on said n input signals.

3. An n-input logic circuit as claimed in claim 1 which carries out an odd parity check operation on said n input signals.

4. An n-input logic circuit for carrying out a parity check operation on n input signals X, $Y_1$, $Y_2$, ..., $Y_{n-1}$, where $n \geq 2$, said n-input logic circuit comprising:
   n inverters for obtaining respective inverted signals $\overline{X}$, $\overline{Y}_1$, $\overline{Y}_2$, ..., $\overline{Y}_{n-1}$ of the n input signals X, $Y_1$, $Y_2$, ..., $Y_{n-1}$;
   a first input line supplied with one of said input signal X and said inverted signal $\overline{X}$;
   a second input line supplied with the other of said input signal X and said inverted signal $\overline{X}$;
   an output line for producing a resulting signal of the parity check operation;
   a first circuit block comprising at least $2^{n-2}$ columns of series connected circuits each comprising n−1 transistors of a first type;
   a second circuit block comprising at least $2^{n-2}$ columns of series connected circuits each comprising n−1 transistors of a second type, said transistors of the first type being one of N-channel and P-channel transistors, said transistors of the second type being the other of the N-channel and P-channel transistors, all of the series connected circuits in said first and second circuit blocks being coupled in parallel between said first input line and said output line;

a third circuit block comprising at least $2^{n-2}$ columns of series connected circuits each comprising $n-1$ transistors of the first type; and a fourth circuit block comprising at least $2^{n-2}$ columns of series connected circuits each comprising $n-1$ transistors of the second type, all of the series connected circuits in said third and fourth circuit blocks being coupled in parallel between said second input line and said output line, in said first circuit block the transistors in one column being supplied with an odd number (i) of input signals selected from said input signals $Y_1$ through $Y_{n-1}$ and $n-1-i$ inverted signals from non-selected input signals from said input signals $Y_1$ through $Y_{n-1}$ so that there are at least $2^{n-2}$ combinations of the odd number of input signals and the inverted signals of the non-selected input signals of the input signals supplied to the transistors of the $2^{n-2}$ columns of series connected circuit, in said second circuit block the transistors in one column being supplied with an odd number (i') of inverted signals of the input signals selected from said input signals $Y_1$ through $Y_{n-1}$ and $n-1-i$ input signals from non-selected signals of said input signals $Y_1$ through $Y_{n-1}$ so that there are at least $2^{n-2}$ combination of the odd number of inverted signals of the input signals and of the non-selected signals of the input signals supplied to the transistors of the $2^{n-2}$ columns of series connected circuits, in said third circuit block the transistors in one column being supplied with zero or an even number (j) of input signals selected from said input signals $Y_1$ through $Y_{n-1}$ and $n-1-i$ inverted signal, from non-selected input signals of said input signals $Y_1$ through $Y_{n-1}$ so that there are at least $2^{n-2}$ combinations of the even number of input signals and inverted signals of the non-selected signals of the input signals supplied to the transistors of the $2^{n-2}$ columns of series connected circuits, in said fourth circuit block the transistors in one column being supplied with zero or an even number (j') of inverted signals of the input signals selected from said input signals $Y_1$ through $Y_{n-1}$ and $n-1-j'$ input signals from non-selected input signals of said input signals $Y_1$ through $Y_{n-1}$ so that there are at least $2^{n-2}$ combinations for the even number of inverted signals of the input signals and the non-selected signals of the input signals supplied to the transistors of the $2^{n-2}$ columns of series connected circuits.

* * * * *